United States Patent
Stearns et al.

[11] Patent Number: 6,111,315
[45] Date of Patent: Aug. 29, 2000

[54] SEMICONDUCTOR PACKAGE WITH OFFSET DIE PAD

[75] Inventors: William P. Stearns, Richardson; Hall E. Jarman, Princeton; Nozar Hassanzadeh, Plano, all of Tex.

[73] Assignee: Texas Instruments Incorporated, Dallas, Tex.

[21] Appl. No.: 08/994,789

[22] Filed: Dec. 19, 1997

Related U.S. Application Data

[60] Provisional application No. 60/037,638, Jan. 21, 1997.

[51] Int. Cl.$^7$ ....................................................... H01L 23/13
[52] U.S. Cl. ............................ 257/706; 257/707; 257/711; 257/730; 257/668; 257/670
[58] Field of Search ..................................... 227/787, 670, 227/676, 667, 668, 730, 707, 711

[56] References Cited

U.S. PATENT DOCUMENTS

| | | | |
|---|---|---|---|
| 5,196,992 | 3/1993 | Sawaya | 361/392 |
| 5,391,923 | 2/1995 | Harada | 257/787 |
| 5,656,864 | 8/1997 | Mitsue et al. | 257/787 |
| 5,714,799 | 2/1998 | Okumura | 257/676 |
| 5,717,252 | 2/1998 | Nakashima et al. | 257/707 |

FOREIGN PATENT DOCUMENTS

| | | | |
|---|---|---|---|
| 4-129253 | 4/1992 | Japan | 257/787 |
| 5-47979 | 2/1993 | Japan | 257/787 |

*Primary Examiner*—John Guay
*Attorney, Agent, or Firm*—Gary C. Honeycutt

[57] ABSTRACT

A semiconductor package includes a stiffener strip (10) having a die pad (18) and a body portion (12). A first surface (4) of the die pad (18) is offset from a second surface (3) of the body portion (12) a predetermined amount. The stiffener strip (10) includes an internal edge (27) concentrically disposed about the die pad (18) and tie straps (16) connecting the internal edge (27) to the die pad (18). A die (28) is affixed to the first surface (4) of the die pad (18). A substrate (20) has a first surface (17) and a second surface (19), with the second surface (19) being affixed to the first surface (2) of the body portion (12). The substrate (20) includes a window (22) and conductive elements (24). A plastic molding material (33) encompasses the die (28), at least a portion of the stiffener strip (10), and at least a portion of the substrate (20).

7 Claims, 5 Drawing Sheets

SEMICONDUCTOR PACKAGE WITH OFFSET DIE PAD

This application claims priority under 35 USC § 119(e)(1) of provisional application No. 060/037,638 filed Jan. 21, 1997.

TECHNICAL FIELD OF THE INVENTION

This invention relates in general to the field of semiconductor device packaging, and more particularly to a semiconductor package with offset die pad and method for manufacturing the same.

BACKGROUND OF THE INVENTION

Many electronic devices include a collection of chips, dies, or other components electrically interconnected using ball grid array packages that connect the dies to a circuit board. It is often desirable to manufacture semiconductor devices with ball grid array packages using conventional techniques, such as plastic transfer molding, that are less complex, more efficient, more productive, and less expensive than the techniques typically used for ball grid array packages, such as liquid encapsulation. In addition, it is desirable to increase the conduction of heat away from the dies of packaged semiconductor devices to improve electrical and thermal performance. For example, absent appropriate heat removal mechanisms, the temperature within and around a typical die may increase to an undesirable extent during operation, leading to reduced performance or even failure of the device.

As semiconductor devices become increasingly complex to satisfy additional processing requirements, reducing or eliminating deleterious temperature effects on electrical performance, while simultaneously reducing the complexity, increasing the efficiency, increasing the productivity, and reducing the expense of the packaging process becomes increasingly important. A known technique for conducting heat away from a die includes thermally connecting the die to an external heat sink to conduct heat away from the die to the heat sink during operation of the device. However, such techniques are often inadequate because the electrical circuitry and associated wires that connect the die to the remainder of the device may leave insufficient space for a desirable thermal connection. As a result, performance may suffer. Furthermore, the substrate of the ball grid array that provides this circuitry, which is often a significant manufacturing expense, may not be limited to the regions in which electrical connection is necessary. Furthermore, conventional manufacturing processes used for semiconductor packages with ball grid arrays often involve relatively complex, inefficient, less productive, and more expensive techniques such as liquid encapsulation.

SUMMARY OF THE INVENTION

The present invention addresses the disadvantages and problems associated with semiconductor packages and methods for manufacturing semiconductor packages.

According to one embodiment of the present invention, a semiconductor package includes a stiffener strip having a die pad and a body portion. A first surface of the die pad is offset from a second surface of the body portion a predetermined amount. The stiffener strip has an internal edge that is concentrically disposed about the die pad and tie straps that connect the internal edge to the die pad. A die is affixed to the first surface of the die pad. A substrate has a first surface and a second surface, with the second surface being affixed to the first surface of the body portion. The substrate also includes a window and multiple conductive elements. A plastic molding material encompasses the die, at least a portion of the stiffener strip, and at least a portion of the substrate.

The semiconductor package and method of the present invention provide several important technical advantages. Providing a semiconductor package with an offset die pad, a body portion, and tie straps that cooperate to conduct heat away from a chip, die, or other component coupled to the die pad more effectively than with prior packages improves the electrical and thermal performance of the associated semiconductor device. The substrate includes circuitry to electrically connect the die to the other components of the electronic device, allowing more of the region that surrounds the die to be allocated to tie straps that increase heat transfer away from the die. Moreover, the spatial extent of the substrate may be limited to the regions of the package in which electrical connection is necessary, resulting in reduced manufacturing and materials costs.

Another important technical advantage of the present invention includes providing a semiconductor package that is manufactured using conventional plastic transfer molding processes that are less complex, more efficient, less expensive, and more productive than alternate techniques used with ball grid arrays such as liquid encapsulation. The process of stamping the stiffener strip, affixing the substrate and die to the stiffener strip, electrically connecting the die to the substrate with wires, and encompassing the resulting structure with plastic molding material is compatible with existing technology, tooling, and equipment to minimize the costs of implementing the invention. A portion of the die pad may remain exposed to the ambient for use as a ground plane or for supporting an external heat sink. In a more particular embodiment, flanges project from external edges of the die pad into the plastic molding material to improve stability of the semiconductor package. The semiconductor package of the present invention provides improved thermal and electrical performance to satisfy increasingly rigorous requirements, while supporting conventional manufacturing processes such as plastic molding.

BRIEF DESCRIPTION OF THE DRAWINGS

For a more complete understanding of the present invention and for further features and advantages thereof, reference is now made to the following description taken in conjunction with the accompanying drawings, in which.

DETAILED DESCRIPTION OF THE INVENTION

Figure 1:
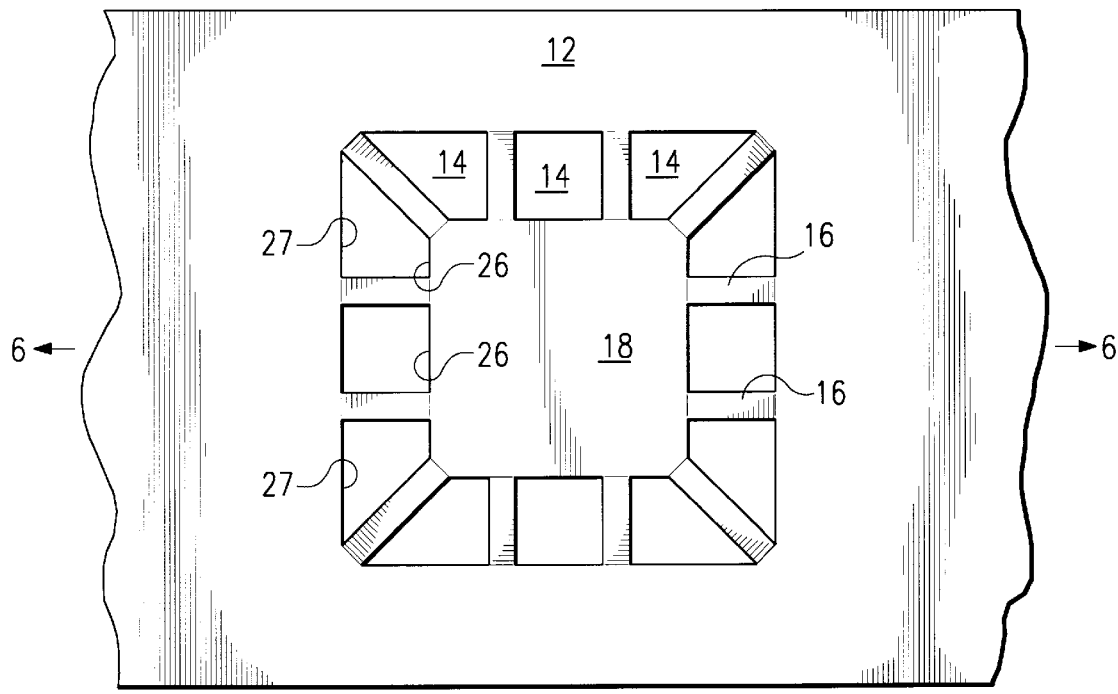
FIGS. 1 and 2 illustrate a stiffener strip having an offset die pad.
Figure 2:
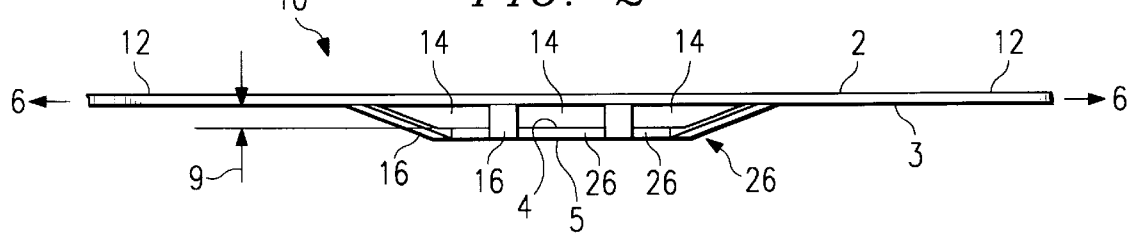

FIGS. 1 and 2 illustrate a stiffener strip 10 with a die pad 18 and a body portion 12 formed concentrically about die pad 18. Body portion 12 includes opposing first and second surfaces 2 and 3, respectively, and die pad 18 includes opposing first and second surfaces 4 and 5, respectively. Tie straps 16 extend from external edges 26 of die pad 18 to internal edges 27 of body portion 12 to connect die pad 18 to body portion 12 and to define one or more openings 14 between die pad 18 and body portion 12. In one embodiment, body portion 12, tie straps 16, and die pad 18 are stamped or etched from an integral piece of metal, such as a nickel plated copper alloy strip. As shown in FIG. 2, first surface 4 of die pad 18 is offset from second surface 3 of body portion 12 a predetermined distance 9, providing an important technical advantage of the present invention. Although tie straps 16 are shown coupling to body portion 12 and die pad 18 at more or less defined angles, the coupling between tie straps 16, body portion 12, and die pad 18 may be substantially rounded, may have a radius bend, or may have any other appropriate configuration.

Stiffener strip 10 may extend longitudinally in the direction of arrows 6 to include four, six, or any other number of offset die pads 18. Stiffener strip 10 may also extend perpendicular to arrows 6 to include any number of offset die pads 18 in any arrangement. Multiple offset die pads 18 may be stamped serially or simultaneously in stiffener strip 10 and corresponding openings 14 may be punched, etched, or cut serially or simultaneously in stiffener strip 10 to define die pad 18 and tie straps 16. The stamping force that offsets die pads 18 may be applied to stiffener strip 10 before, during, or after openings 14 are created in stiffener strip 10.

Figure 3:
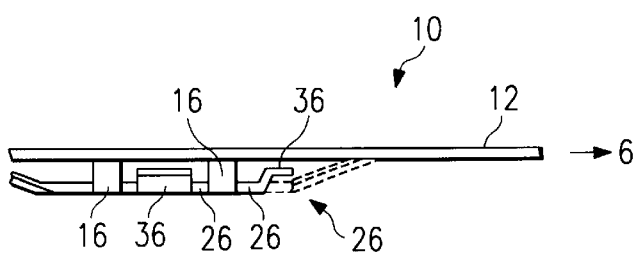
FIG. 3 illustrates a stiffener strip with an offset die pad and flanges.

Referring to FIG. 3, stiffener strip 10 may include flanges 36 that project from external edges 26 of die pad 18, internal edges 27 of body portion 12, or the edges of tie straps 16, in any combination. In one embodiment, flanges 36 are integral to die pad 18. Flanges 36 may include bends or other features that allow flanges 36 to anchor or otherwise stabilize stiffener strip 10 and the associated semiconductor device with respect to a plastic molding material, as discussed below with reference to FIGS. 6 and 7. Die pad 18, tie straps 16, and body portion 12 cooperate to conduct heat away from a die affixed to die pad 18 and the semiconductor package as a whole to improve electrical and thermal performance.

Figure 4:
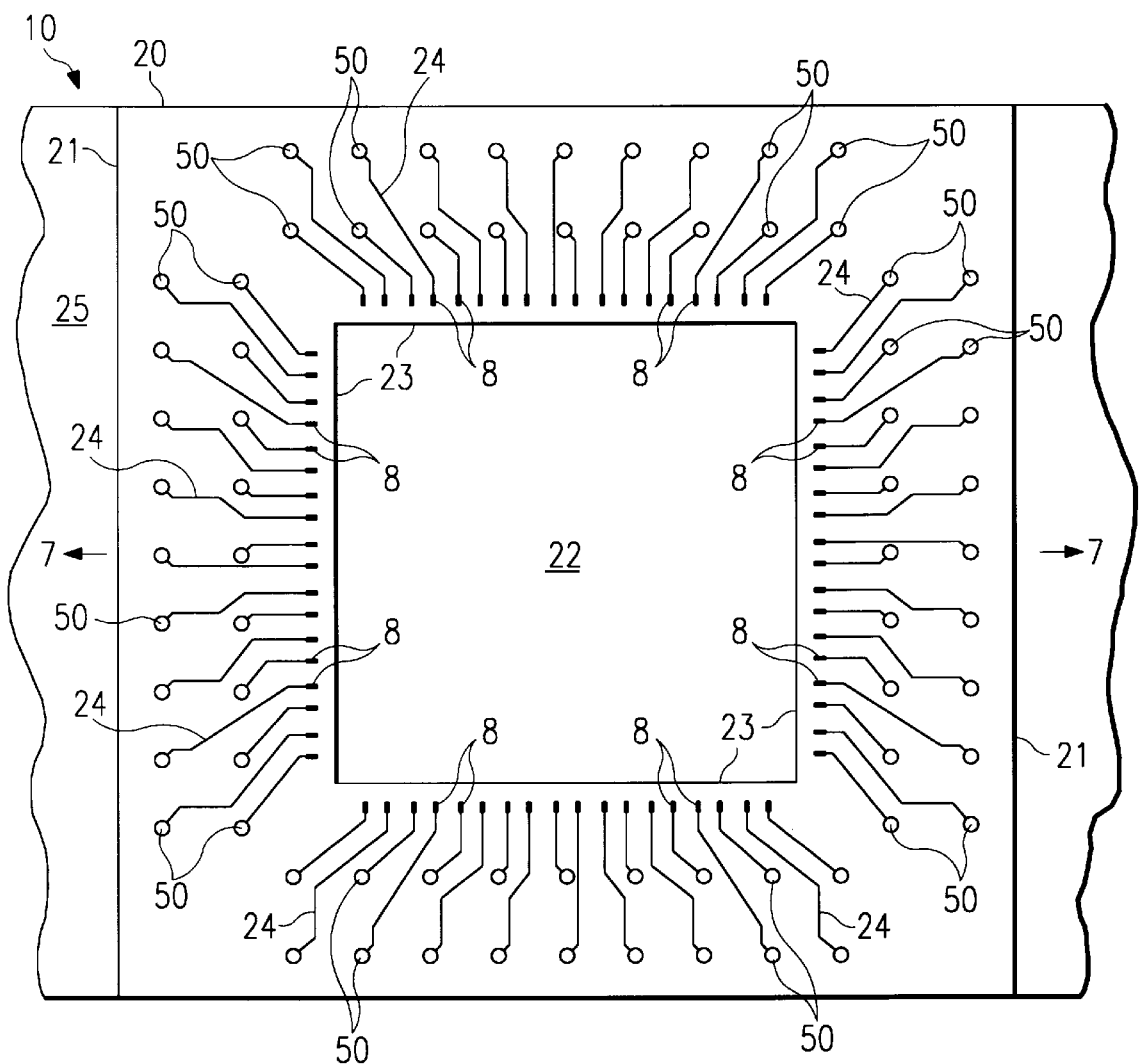
FIG. 4 illustrates a substrate that has conductive elements.

FIG. 4 illustrates a substrate 20 constructed from one or more layers of laminate, film-based, rigid, or other dielectric material that is suitable to support conductive elements 24 that are integral to or separate from substrate 20. Each conductive element 24 has a first end 8 and a second end 50. During the manufacture of the associated semiconductor package, solder or other conductive balls are affixed to second ends 50 of conductive elements 24 to form a ball grid array. Conductive elements 24 may be in any number and in any arrangement to provide electrical circuitry for the die, the arrangement of FIG. 4 being exemplary. Some portions of substrate 20 and conductive elements 24 may be wholly or partially covered with a solder mask or other protective coating.

Substrate 20 has opposing first and second surfaces 17 and 19, respectively. A window 22 that defines internal edges 23 of substrate 20 may be cut, punched, etched, or otherwise formed such that internal edges 23 may align coextensively with internal edges 27 of body portion 12 when substrate 20 is laminated to stiffener strip 10. Substrate 20 may be substantially continuous in the direction of arrows 7, with multiple windows 22 formed periodically along the length of substrate 20. In the alternative, substrate 20 may have a single window 22, with external edges 21 defining the entire extent of substrate 20 in the direction of arrows 7. Substrate 20 may also extend perpendicular to arrows 7 to include an array of windows 22. Substrate 20 and window 22 may be in any number and any configuration suitable for lamination to and coextensive alignment with stiffener strip 10. For flip chip bonding, window 22 may be absent and substrate 20 may be substantially continuous opposite offset die pad 18 with openings suitable to allow a plastic molding material to encompass the appropriate portions of stiffener strip 10, substrate 20, the die, and other suitable components of the semiconductor package. In this situation, some or all conductive elements 24 may extend into substrate 20 opposite offset die pad 18.

In one embodiment, substrate 20 and stiffener strip 10 are formed separately according to conventional processing techniques that are tailored to the different challenges and requirements each structure presents. As a result, the experience developed in the mass production of structures such as stiffener strip 10 and substrate 20 may be brought to bear separately without complicating either technology with constraints associated with the other. This allows multiple stiffener strips 10 and substrates 20 to be separately produced, as individual units or substantially continuous strips, and efficiently affixed to one another. Furthermore, stiffener strip 10 and substrate 20 may be produced without extensive changes to existing tooling and other equipment. As a result, the semiconductor package of the present invention is manufactured using a process that is less complex, more productive, more efficient, and less expensive than other techniques used in connection with ball grid arrays, while providing improved electrical and thermal performance as discussed above.

Figure 5:
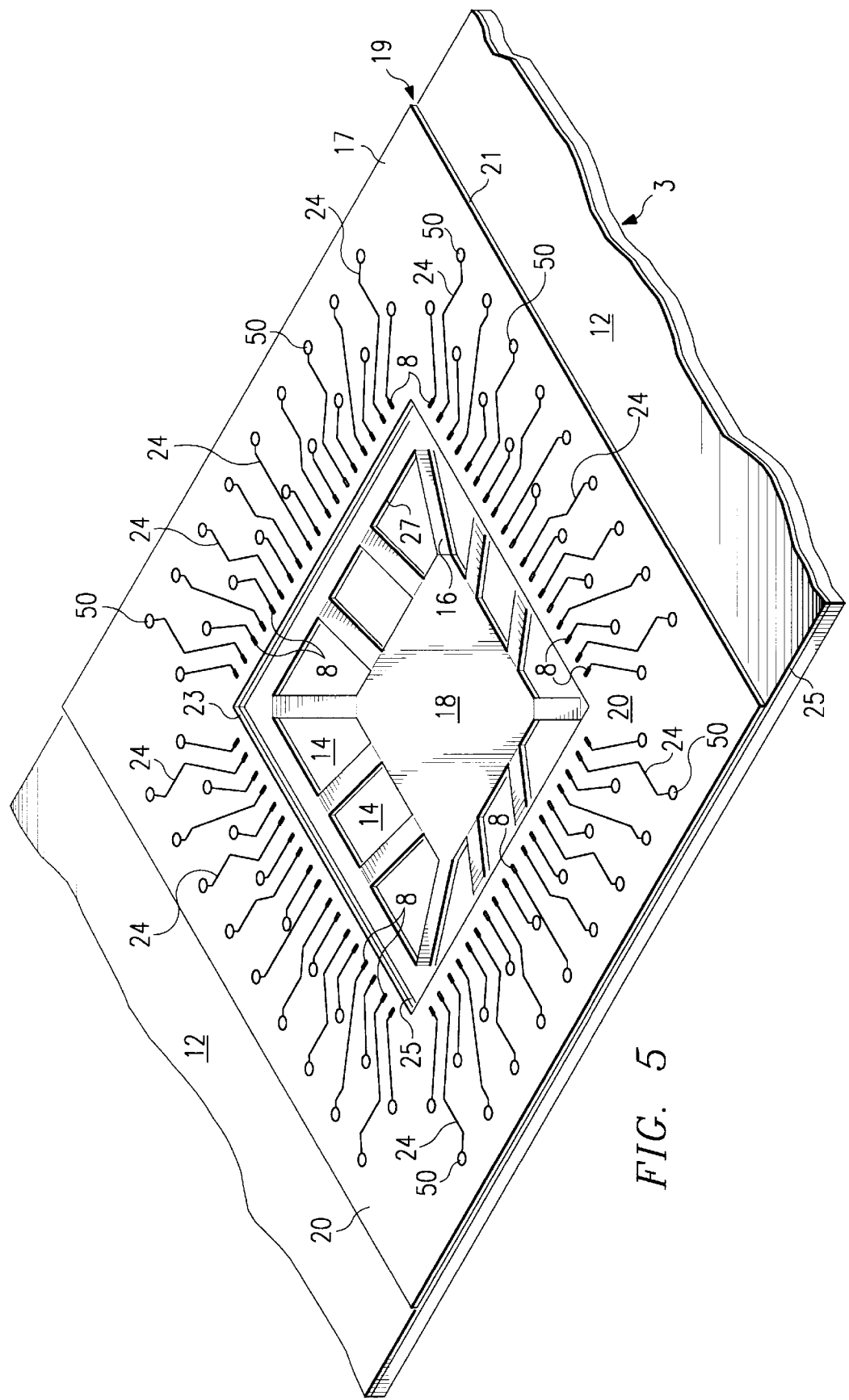
FIG. 5 illustrates a substrate that is affixed to a stiffener strip having an offset die pad.

Referring to FIG. 5, second surface 19 of substrate 20 has been laminated to first surface 2 of body portion 12 such that tie straps 16 and die pad 18 are viewable through window 22. An adhesive layer 25 may be applied to portions of stiffener strip 10, substrate 20, or both stiffener strip 10 and substrate 20 before substrate 20 is laminated to stiffener strip 10. Adhesive layer 25 may cooperate with heat or pressure to affix to substrate 20 to stiffener strip 10. In one embodiment, stiffener strip 10, substrate 20, and adhesive layer 25 are formed and affixed together as extended strips associated with multiple offset die pads 18, such that multiple semiconductor packages may be mass produced. Multiple substrates 20 may be laminated to an extended stiffener strip 10 having multiple offset die pads 18 serially or simultaneously. An extended substrate 20 having multiple windows 22 and corresponding conductive elements 24 may be serially or simultaneously laminated to individual stiffener strips 10. Other arrangements may also be suitable.

During the operation of the semiconductor package that includes stiffener strip 10, offset die pad 18, tie straps 16, and body portion 12 of stiffener strip 10 cooperate to conduct heat away from a die affixed to first surface 4 of offset die pad 18 and electrically connected to conductive elements 24 using wires bonded to the die and to conductive elements 24. In one embodiment, the total heat transferred from the die increases as tie straps 16 increase in number or total area. Since conductive elements 24 of substrate 20 provide circuitry to electrically connect the die to other components of the semiconductor package, the need for the conventional leads that often surround dies in previous semiconductor packages is reduced or eliminated. As a result, a larger portion of the region surrounding the die may be allocated to tie straps 16, with a corresponding increase in thermal conductivity away from the die and improved device performance.

Figure 6:
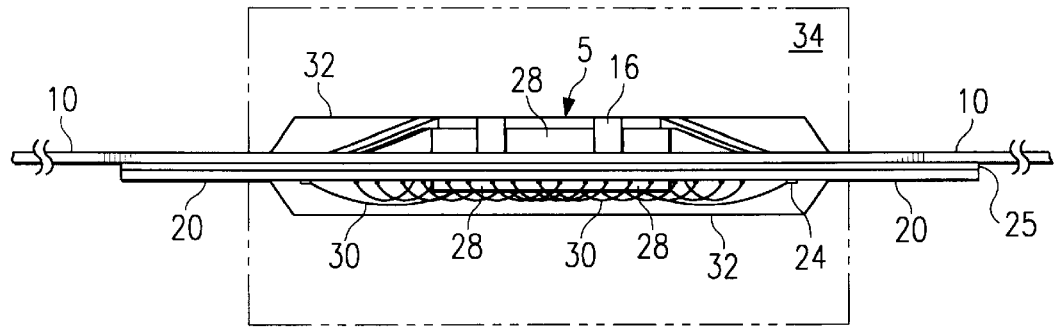
FIG. 6 illustrates an arrangement for encompassing a semiconductor device with a plastic molding material.

FIG. 6 illustrates an exemplary arrangement for encompassing a die 28, at least a portion of stiffener strip 10, and at least a portion of substrate 20 with a plastic molding material in a transfer mold 34. Mold 34 is constructed to close upon stiffener strip 10 and substrate 20 from opposing sides. As shown in FIG. 6, die 28 has been affixed to offset die pad 18, wires 30 have been bonded to conductive elements 24 and die 28 to electrically connect die 28 and conductive elements 24, and the resulting assembly has been inverted, although inversion is not required. Using the arrangement shown in FIG. 6, the semiconductor package, which will eventually include a complete ball grid array, is encompassed using plastic transfer molding techniques for ball grid array packages. The top of die 28 may be below, above, or coincident with first surface 17 of substrate 20.

If tab bonding is used to replace or combine with wire bonding, tabs will extend from substrate 20 into window 22 for bonding to die 28. Alternatively, if flip chip bonding is used, die 28 may be connected to conductive elements 24 extending into a portion of substrate 20 that is disposed opposite die 28 and offset die pad 18. Although wires 30 are shown, the present invention contemplates wires, tabs, connections for flip chip bonding, or any other suitable electrical connectivity between substrate 20 and die 28. The inverted arrangement shown in FIG. 6 may make it easier to affix an external heat sink to second surface 5 of offset die pad 18 before, during, or after the plastic transfer molding is complete.

During operation of mold 34, plastic molding material or other suitable thermosetting material is transferred into cavity 32 to wholly or partially fill cavity 32 and encompass die 28, at least a portion of stiffener strip 10, and at least a portion of substrate 20. Mold 34 may be configured such that at least a portion of second surface 5 of die pad 18 is exposed to the ambient after the semiconductor package is removed from mold 34. As discussed above, exposed second surface 5 may provide a ground plane or support for an external heat sink affixed to second surface 5. The semiconductor package is then removed from mold 34 and placed in use or subjected to further processing, as discussed more fully below. The ability to manufacture a semiconductor package that includes a ball grid array in this manner allows complete or partial replacement of the techniques typically used for ball grid array packaging, such as liquid encapsulation.

In operation of the semiconductor package, thermal conductivity and cooling of die 28 is increased to improve electrical and thermal performance. Flanges 36 help to anchor or otherwise stabilize stiffener strip 10 after the semiconductor device has been encompassed with the plastic molding material. Tie straps 16 conduct heat away from die 28 and offset die pad 18 to body portion 12 of stiffener strip 10. Offset die pad 18 and substrate 20 cooperate to reduce or eliminate the need for electrically conductive leads often associated with prior packages, allowing the total thermally conductive area of tie straps 16 to be increased. The advantages provided by offset die pad 18, tie straps 16, and flanges 36 may combine in any manner to improve the electrical, thermal, and structural performance of the semiconductor package.

Figure 7:
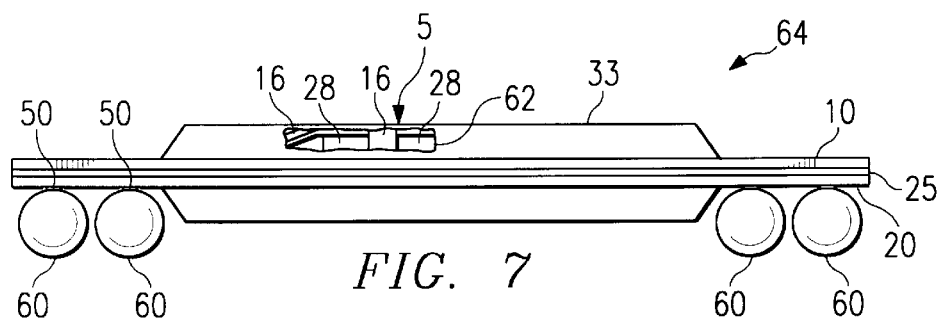
FIGS. 7 and 8 illustrate a semiconductor package.
Figure 8:
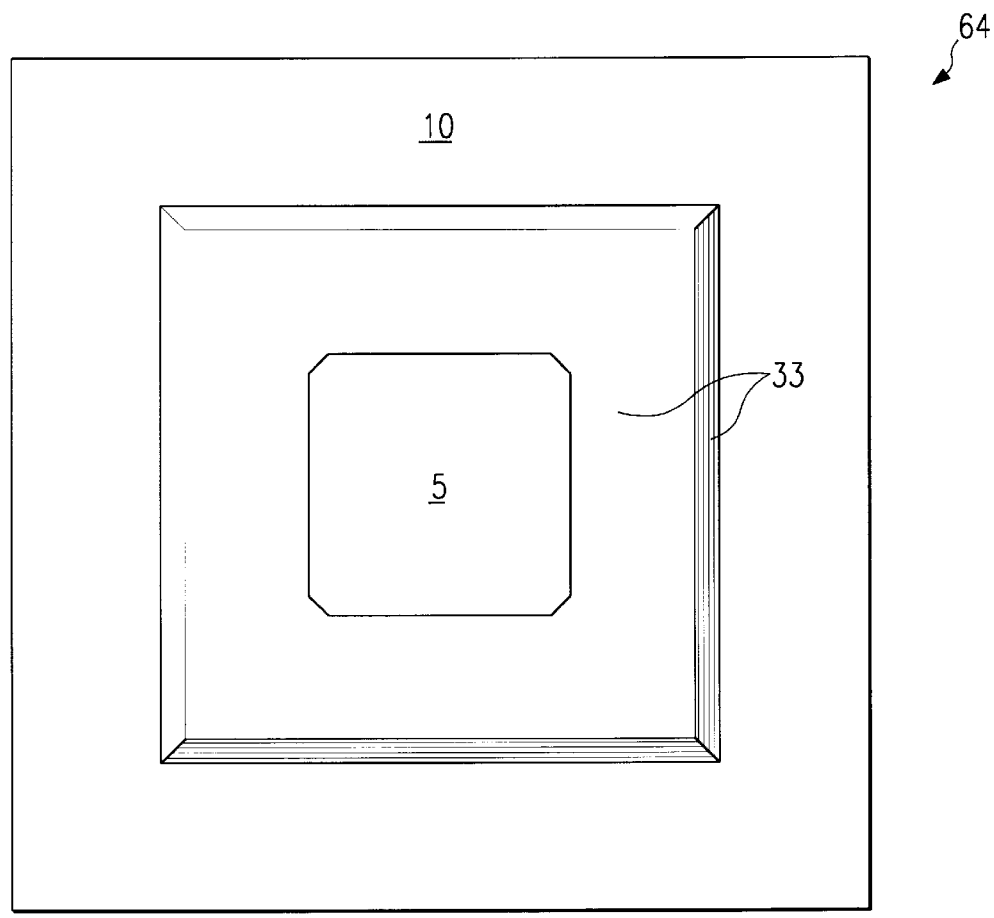

FIG. 7 illustrates semiconductor package 64 after being removed from mold 34 and separated from one or more other semiconductor packages 64 manufactured from the same stiffener strip 10. Conductive balls 60 have been affixed to second ends 50 of conductive elements 24 to form a complete ball grid array package. Typically, conductive balls 60 are attached to substrate 20 after semiconductor package 64 has been separated from other semiconductor packages 64. Although conductive balls 60 are shown as spherical, conductive balls 60 may have any geometry. Conductive balls 60 may be in any number and in any arrangement corresponding to the arrangement of conductive elements 24, the arrangement of FIG. 7 being exemplary. Window 62 is included in FIG. 7 to show the arrangement of tie straps 16 and die 28 after being encompassed within plastic molding material 33. FIG. 8 further illustrates semiconductor package 64 after removal from mold 34. Second surface 5 of die pad 18 is exposed to the ambient and may be used as a ground plane or to support an external heat sink.

Figure 9:
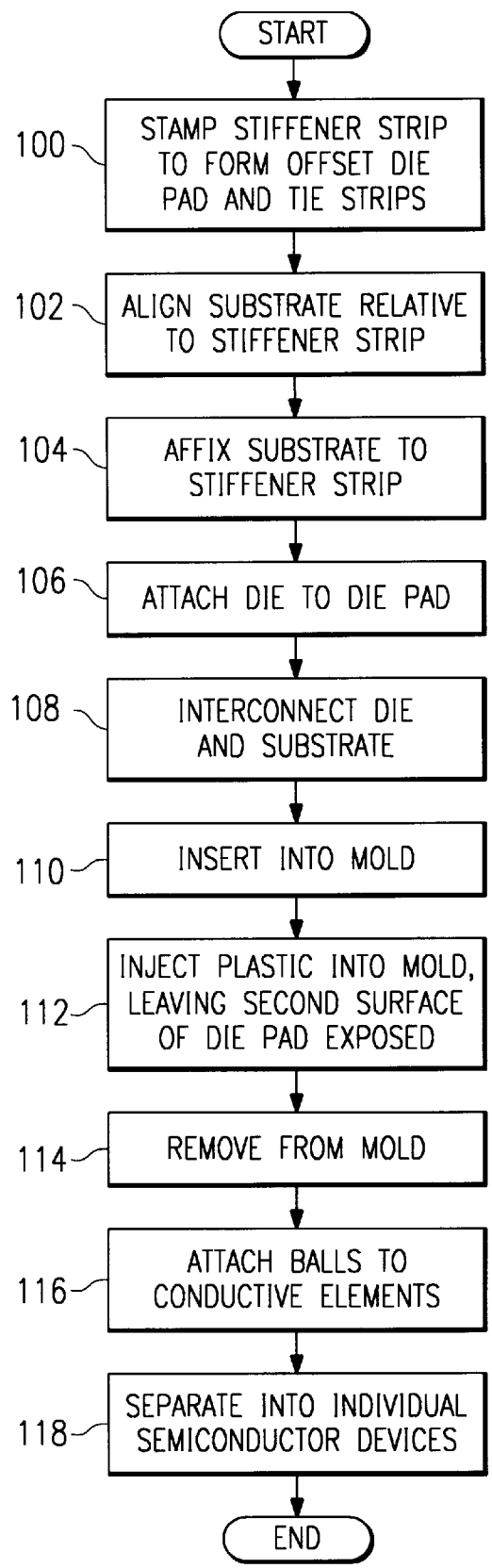
FIG. 9 is a flow chart of a method of manufacturing a semiconductor package.

FIG. 9 is a flow chart of a method of manufacturing semiconductor package 64. The method begins at step 100, where stiffener strip 10 is stamped or etched to form one or more offset die pads 18 and corresponding tie straps 16 as discussed above with reference to FIGS. 1 through 3. At step 102, substrate 20 is aligned relative to stiffener strip 10 such that internal edges 23 of substrate 20 may coextensively align with internal edges 27 of stiffener strip 10. More than one substrate 20 may be aligned with stiffener strip 10 at step 102 if stiffener strip 10 has multiple offset die pads 18. At step 104, substrate 20 is laminated or otherwise affixed to stiffener strip 10 using adhesive layer 25, directly or in combination with heat and pressure. Stiffener strip 10, substrate 20, and adhesive layer 25 may be laminated to one another as substantially continuous strips, such that multiple packages 64 may be constructed in an efficient and productive manner. Stiffener strip 10 having multiple offset die pads 18 may be advanced substantially perpendicular to substrate 20 having multiple windows 22 or in any other manner suitable to mass produce semiconductor packages 64.

At step 106, die 28 is affixed to first surface 4 of offset die pad 18 using curable epoxy or otherwise. In one embodiment, wires 30 are bonded to die 28 and first ends 8 of conductive elements 24 at step 108, although steps 106 and 108 may occur in any relative order. Tab bonding, flip chip bonding, or other bonding techniques may also be used to interconnect die 28 and conductive elements 24. At step 110, the resulting assembly is inserted into mold 34. In one embodiment, at least a portion of second surface 5 of die pad 18 contacts the inner surface of mold 34 when mold 34 is closed to allow second surface 5 to remain exposed to the ambient after the encompassing of semiconductor package 64 with plastic molding material 33 is complete. Exposed second surface 5 may be used as a ground plane or to support an external heat sink, as discussed above.

At step 112, plastic molding material 33 is injected or transferred into cavity 32 of mold 34 to encompass die 28, at least a portion of stiffener strip 10, and at least a portion of substrate 20. Flanges 36 are surrounded by plastic molding material 33, anchoring or stabilizing semiconductor package 64 relative to plastic molding material 33. At any time before, during, or after plastic molding material 33 has hardened to take a more permanent shape, semiconductor package 64 is removed from mold 34 at step 114. At step 116, conductive balls 60 are affixed to second ends 50 of the corresponding conductive elements 24. Reflow may be performed to better distribute the solder or other material that forms conductive balls 60 over the appropriate regions of substrate 20. At step 118, if necessary, semiconductor package 64 is separated from other semiconductor packages 64, and the method ends. Steps 116 and 118 may occur in any relative order. One or more additional processing steps may replace or combine with steps discussed above, for example, a solder mask may be coupled to substrate 20 before insertion into mold 34.

Although the present invention has been described above in connection with several embodiments, it should be understood that a plethora of changes, substitutions, variations, alterations, transformations, and modifications may be suggested to one skilled in the art, and it is intended that the present invention encompass such changes, substitutions, variations, alterations, transformations, and modifications as fall within the spirit and scope of the appended claims.

What is claimed is:

1. A semiconductor package, comprising:

a stiffener strip comprising a die pad having a first surface and a second surface and a body portion having a first surface and a second surface, the first surface of the die pad being offset from the second surface of the body portion a predetermined amount, the stiffener strip further comprising an internal edge concentrically disposed about the die pad and a plurality of tie straps connecting the internal edge to the die pad;

a die affixed to the first surface of the die pad; a substrate comprising a first surface and a second surface, the second surface of the substrate being affixed to the first surface of the body portion, the substrate further comprising a window and a plurality of conductive elements, each conductive element having a first end and a second end;

a plastic molding material that encompasses the die, at least a substantial portion of the stiffener strip, and at least a substantial portion of the substrate; but exposes substantially the entire second surface of the die pad; and wherein the die pad further comprises at least one flange that projects from an external edge of the die pad into the plastic molding material to anchor the die pad relative to the plastic molding material.

2. The package of claim 1, further comprising a plurality of wires, each wire being bonded to the die and to the first end of a corresponding conductive element of the substrate.

3. The package of claim 1, wherein the second surface of the substrate is laminated to the first surface of the body portion.

4. The package of claim 1, wherein the die pad, body portion, and tie straps are formed from an integral piece of metal.

5. The package of claim 1, further comprising an adhesive layer that couples the first surface of the body portion to the second surface of the substrate.

6. The package of claim 1, further comprising a plurality of conductive balls, each conductive ball affixed to the second end of a corresponding conductive element to form a ball grid array.

7. A semiconductor package, comprising:

a stiffener strip comprising a die pad having a first surface and a second surface and a body portion having a first surface and a second surface, the first surface of the die pad being offset from the second surface of the body portion a predetermined amount, the stiffener strip further comprising an integral edge concentrically disposed about the die pad and a plurality of the straps connecting the internal edge to the die pad;

a die affixed to the first surface of the die pad; a substrate having a first surface and a second surface, the second surface of the substrate being laminated to the first surface of the body portion, the substrate comprising a window and a plurality of conductive elements, each conductive element having a first end and a second end;

a plurality of wires, each wire being bonded to the die and to the first end of a corresponding conductive element of the substrate;

a plurality of conductive balls, each conductive ball affixed to the second end of a corresponding conductive element to form a ball grid array;

a plastic molding material that encompasses the die; at least a portion of the stiffener strip, and at least a portion of the substrate, but exposes substantially the entire second surface of the die pad; and wherein the die pad further comprises at least one flange that projects from an external edge of the die pad into the plastic molding material to anchor the die pad relative to the plastic molding material.

* * * * *